United States Patent
Zaiki et al.

(10) Patent No.: US 10,117,347 B2
(45) Date of Patent: Oct. 30, 2018

(54) ACCOMMODATION DEVICE FOR ELECTRONIC PARTS

(71) Applicant: DENSO CORPORATION, Kariya, Aichi-pref. (JP)

(72) Inventors: Hiroyuki Zaiki, Kariya (JP); Takashi Tsuboi, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 6 days.

(21) Appl. No.: 15/178,400

(22) Filed: Jun. 9, 2016

(65) Prior Publication Data

US 2016/0361676 A1    Dec. 15, 2016

(30) Foreign Application Priority Data

Jun. 11, 2015    (JP) .................................. 2015-118375

(51) Int. Cl.
     *H05K 5/02*      (2006.01)
     *H05K 5/03*      (2006.01)

(52) U.S. Cl.
     CPC ............. *H05K 5/0239* (2013.01); *H05K 5/03* (2013.01)

(58) Field of Classification Search
     CPC .......................... B01D 46/2414; B01D 53/22; B01D 2279/35; B01D 53/88; B01D 96/2422; B01D 53/885; H05K 5/021; F21S 48/332
     USPC ................ 55/385.4, 502, 385.6; 96/4; 95/45
     See application file for complete search history.

(56) References Cited

U.S. PATENT DOCUMENTS

| | | | | |
|---|---|---|---|---|
| 4,863,499 A | * | 9/1989 | Osendorf | B01D 45/06 360/99.18 |
| 5,359,475 A | * | 10/1994 | Aseere | B01D 46/0005 360/130.24 |
| 6,214,070 B1 | * | 4/2001 | Crowder | B01D 46/10 360/99.22 |
| 8,568,503 B2 | * | 10/2013 | Sasaki | B01D 46/543 55/385.6 |
| 8,814,993 B2 | * | 8/2014 | Yano | F21S 48/332 55/385.4 |
| 2002/0190485 A1 | | 12/2002 | Ohyama et al. | |

(Continued)

FOREIGN PATENT DOCUMENTS

| | | |
|---|---|---|
| JP | 2006-5162 A | 1/2006 |
| JP | 2011-165748 A | 8/2011 |

(Continued)

*Primary Examiner* — Duane Smith
*Assistant Examiner* — Minh-Chau T. Pham
(74) *Attorney, Agent, or Firm* — Knobbe, Martens, Olson & Bear, LLP

(57) ABSTRACT

An accommodation device of a water-proof casing has a casing body and a casing cover. A control unit is accommodated in an accommodation space formed in the accommodation device. An air breathing hole is formed in the casing cover for communicating the accommodation space to an outside of the accommodation device. A filter element is fixed to a bottom surface of a filter accommodation portion, which is formed on an outside surface of the casing cover, so as to close an open end of the air breathing hole. A filter cover is fixed to the casing cover so as to cover the filter element. A cover positioning portion is formed in the filter accommodation portion on the bottom surface, so that the filter cover can be easily and correctly positioned with respect to the casing cover.

10 Claims, 7 Drawing Sheets

(56) References Cited

U.S. PATENT DOCUMENTS

| | | | | |
|---|---|---|---|---|
| 2005/0091949 A1* | 5/2005 | Origlia | ............... | B60R 16/0239 55/385.4 |
| 2005/0091950 A1* | 5/2005 | Weaver | .................. | B60T 11/26 55/385.4 |
| 2009/0084078 A1* | 4/2009 | Furuyama | ............. | F21S 48/335 55/385.4 |
| 2016/0174397 A1* | 6/2016 | Ishii | ........................ | F21V 31/03 55/385.4 |

FOREIGN PATENT DOCUMENTS

| | | |
|---|---|---|
| JP | 2012-245945 | 12/2012 |
| JP | 2014-175365 | 9/2014 |

\* cited by examiner

ACCOMMODATION DEVICE FOR ELECTRONIC PARTS

CROSS REFERENCE TO RELATED APPLICATION

This application is based on Japanese Patent Application No. 2015-118375 filed on Jun. 11, 2015, the disclosure of which is incorporated herein by reference.

FIELD OF TECHNOLOGY

The present disclosure relates to an accommodation device for electronic parts and further relates to an electronic device having the accommodation device.

BACKGROUND

A water-proof housing for accommodating an electronic circuit board or the like is known in the art, for example, as disclosed in Japanese Patent Publication No. 2011-165748. According to the above prior art, a cover member is fixed to a housing for accommodating an electronic circuit board. An air ventilation through-hole is formed in the cover member. A filter element is attached to an outer surface of the cover member by a double-faced adhesive tape so as to cover the air ventilation through-hole. The filter element and the double-faced adhesive tape form an air breathing filter unit. A shielding member is further provided above the air breathing filter unit.

According to the above prior art, the shielding member of a plate shape is attached to the cover member by adhesive material at a position above the air breathing filter unit in order to protect the air breathing filter unit. According to the above prior art, there is no positioning means for the shielding member. It is, therefore, difficult to properly and easily assemble the shielding member to the cover member at a correct position.

SUMMARY OF THE DISCLOSURE

The present disclosure is made in view of the above problem. It is an object of the present disclosure to provide an accommodation device, to which a filter cover for protecting a filter member can be easily assembled. It is another object of the present disclosure to provide an electronic device for a vehicle having the above accommodation device.

According to one of features of the present disclosure, an accommodation device has a casing body, a casing cover, a filter accommodation portion, a filter element and a filter cover.

The casing body accommodates a protective component, for example, a control unit.

The casing cover is fixed to the casing body so as to form an accommodation space for accommodating the protective component. An air breathing hole is formed in the casing cover for communicating the accommodation space to an outside of the accommodation device.

The filter accommodation portion is formed on an outside surface of the casing cover. The filter accommodation portion has a bottom surface, wherein an outside end of the air breathing hole is opened at the bottom surface while an inside end of the air breathing hole is opened at an inside surface of the casing cover, that is, the accommodation space.

The filter element is fixed to the bottom surface of the filter accommodation portion for covering the outside end of the air breathing hole.

The filter cover is fixed to the casing cover for covering the filter element.

A cover positioning portion is formed in the filter accommodation portion of the casing cover for positioning the filter cover with respect to the casing cover.

According to the above feature of the present disclosure, it is possible to properly protect the filter element because the filter element is covered by the filter cover. In addition, since the cover positioning portion is formed in the recessed portion of the casing cover, it is possible to properly position the filter cover with respect to the casing cover. In other words, it becomes easier to assemble the filter cover to the casing cover.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION OF THE EMBODIMENTS

Figure 1:
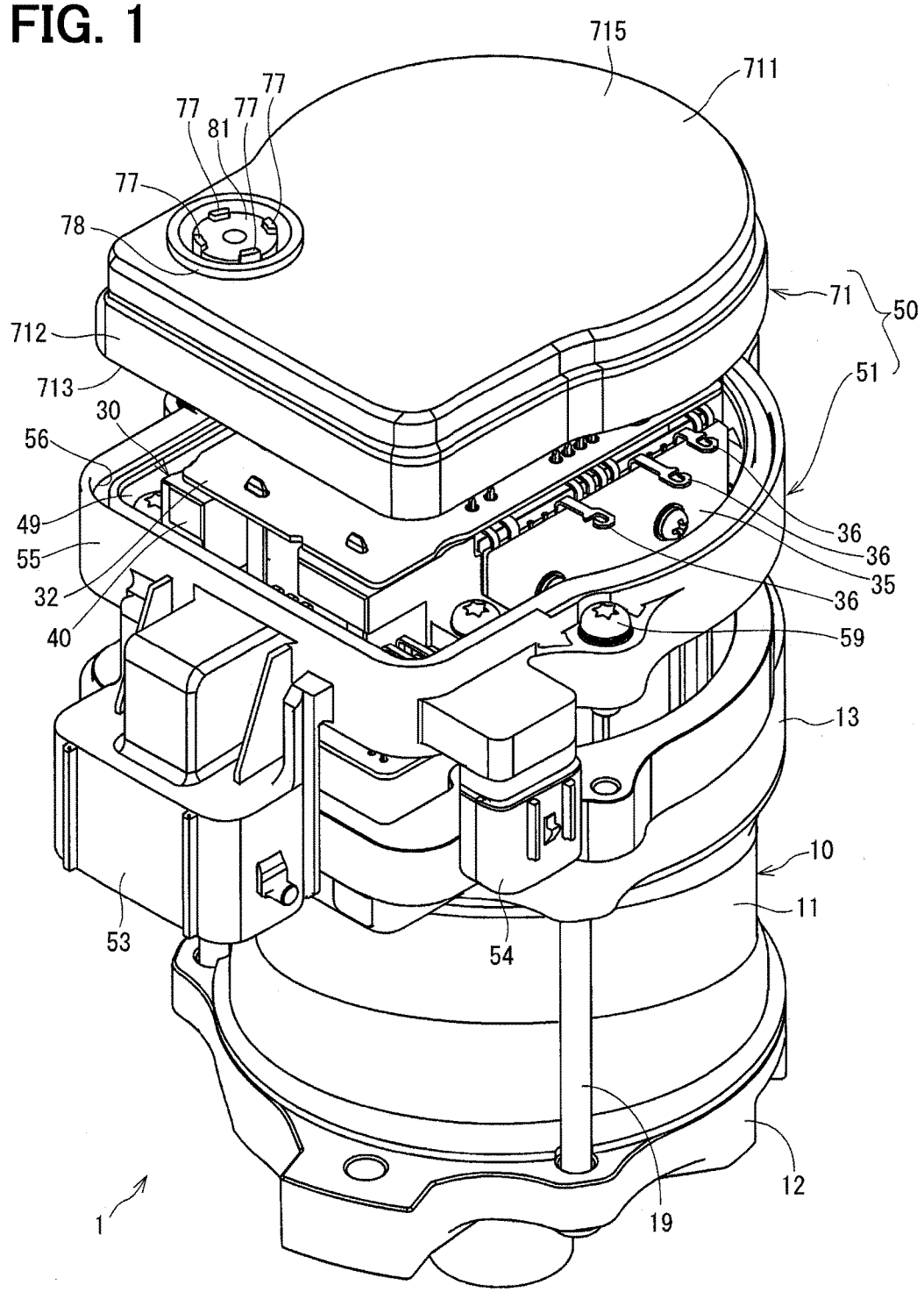
FIG. 1 is a schematically exploded perspective view showing a driving device according to a first embodiment of the present disclosure.

The present disclosure will be explained hereinafter by way of multiple embodiments and/or modifications with reference to the drawings. The same reference numerals are given to the same or similar structures and/or portions throughout the multiple embodiments and/or modifications in order to avoid repeated explanation.

First Embodiment

A first embodiment of the present disclosure will be explained with reference to FIGS. 1 to 10.

As shown in FIG. 1, a water-proof casing 50, which is an accommodation device of the present disclosure, is applied to, for example, a driving device 1 for an electrical apparatus mounted in a vehicle. The driving device 1 is, for example, an electrical power steering device for the vehicle and usually mounted in an engine room of the vehicle.

The driving device 1 has an electric motor 10, a control unit 30 and the water-proof casing 50 (the accommodation device 50) for accommodating the control unit 30. In the present disclosure, the control unit 30 corresponds to a protective component accommodated in the accommodation device 50. In the driving device 1, the control unit 30 is provided at one axial side of the electric motor 10. In the present embodiment, the control unit 30 is provided on a rear side (an upper side in FIG. 1) of the electric motor 10 opposite to an output side (a lower side in FIG. 1) of the electric motor 30. The driving device 1 of the present embodiment is a mechanical-and-electrical integrated device.

The electric motor 10 of the present embodiment is composed of a three-phase brush-less type electric motor. An outer frame of the electric motor 10 is composed of a cylindrical motor casing 11, a front end frame 12 and a rear end frame 13, wherein each of the front and the rear end frames 12 and 13 closes each axial end of the motor casing 11. Although not shown in the drawings, a stator, a rotor, a rotating shaft rotating together with the rotor, and so on are accommodated in the motor casing 11.

Multiple stator coils are wound on a stator core and each coil terminal extending from the respective stator coil is outwardly projected from the rear end frame 13 of the electric motor 10. Power modules 35 (explained below) are provided on the rear side of the electric motor 10 and the coil terminals are electrically connected to the power modules 35.

The control unit 30 is composed of a control circuit board (not shown), a power circuit board 32, the power modules 35, a heat sink 40 and so on.

Electronic parts and/or components (not shown) for a control system, such as, a micro-computer, pre-driver circuits and so on, are mounted to the control circuit board (not shown), which is provided between the heat sink 40 and the rear side of the electric motor 10 (on a front side of the heat sink 40) and fixed to the heat sink 40 and/or the electric motor 10 by any well-known fixing means, such as screws, bolts or the like.

The power circuit board 32, which is provided on a rear side of the heat sink 40 (opposite to the front side of the heat sink 40 facing the electric motor 10), is likewise fixed to the heat sink 40 and/or the electric motor 10 by any well-known fixing means, such as screws, bolts or the like. Electrical parts and/or components (not shown) of a power system having relatively high current-carrying capacity, such as, a choke coil, a capacitor and so on, are mounted to the power circuit board 32.

Each of the power modules 35, which has switching elements for controlling electrical power supply to the stator coils, is fixed to the heat sink 40 so that heat can be transferred from the power module 35 to the heat sink 40.

The power module 35 is arranged in such a way that it is parallel to an axial direction of the electric motor 10, more exactly, in parallel to a virtual line outwardly extending from a center axis of the electric motor 10. The power module 35 is electrically connected to the control circuit board and the power circuit board 32. Motor terminals 36 are provided in the power module 35 so as to outwardly extend from the power circuit board 32. The motor terminals 36 are electrically connected to the respective coil terminals (not shown) of the stator coils. In the present embodiments, two sets of the three-phase stator coils are provided. The power module 35 is provided for each set of the three-phase stator coils. Therefore, two power modules 35 are provided at both sides of the heat sink 40, which are opposing to each other in a radial direction of the electric motor 10.

In the present embodiment, each of the control circuit board, the power circuit board 32, parts and/or components mounted to those of the circuit boards and the power modules 35 separately or collectively corresponds to electronic components included in the meaning of the protective component, which are accommodated in the water-proof casing 50.

The heat sink 40, which is made of such material having high heat conductivity, such as, aluminum or the like, supports the control circuit board, the power circuit board 32 and the power modules 35. The heat sink 40 is fixed to the rear end frame 13 by any suitable fixing means (such as, screws, bolts and so on), in a condition that the above control circuit board, the power circuit board 32 and the power modules 35 are assembled to the heat sink 40.

The water-proof casing 50 (the accommodation device 50) has a connector casing 51 and a casing cover 71.

The connector casing 51 is made of resin or the like in such a way that a first connector portion 53, a second connector portion 54 and a main body portion 55 are integrally formed as one unit. The connector casing 51 is fixed to the rear end frame 13 by screws 59. An O-ring (not shown) is provided between the connector casing 51 and the rear end frame 13 at such a portion, at which the connector casing 51 and the rear end frame 13 are in contact with each other. According to such a structure, extraneous material including water is prevented from entering an inside space formed by the connector casing 51, the rear end frame 13 and the casing cover 71 via a gap between the connector casing 51 and the rear end frame 13. The connector casing 51 is also referred to as a casing body 51.

Each of the first and the second connector portions 53 and 54 is integrally formed with the main body portion 55 so as to outwardly protrude from the main body portion 55 in the radial direction. The electronic components accommodated in the water-proof casing 50 are electrically connected to a battery, CAN (Controller Area Network), various kinds of sensors and so on via the first and the second connector portions 53 and 54.

The main body portion 55 is formed in a cylindrical shape. An adhesion groove 56 is formed on a rear side of the main body portion 55, that is, on a side of the main body portion 55 opposite to the electric motor 10.

The casing cover 71 is formed in a cylindrical shape having a closed top end. The casing cover 71 is provided at the rear side of the main body portion 55 (that is, a rear side of the driving device 1 opposite to the electric motor 10). The casing cover 71 has a top end portion 711 and a peripheral wall portion 712. A fitting portion 713 is formed at a front side of the peripheral wall portion 712 (at a lower side of the peripheral wall portion 712 in FIG. 1). The fitting portion 713 is inserted into the adhesion groove 56 of the connector casing 51 and fixed to the connector casing 51, for example, by adhesive material. According to such a structure, the extraneous material (for example, water) is prevented from entering the inside space formed by the connector casing 51, the rear end frame 13 and the casing cover 71 via a gap between the connector casing 51 and the casing cover 71.

In the present embodiment, the control unit 30 (including the power circuit board 32, the power modules 35 and so on) is accommodated in an accommodation space 49, which corresponds to the inside space formed by the connector casing 51, the rear end frame 13 and the casing cover 71.

Figure 2:
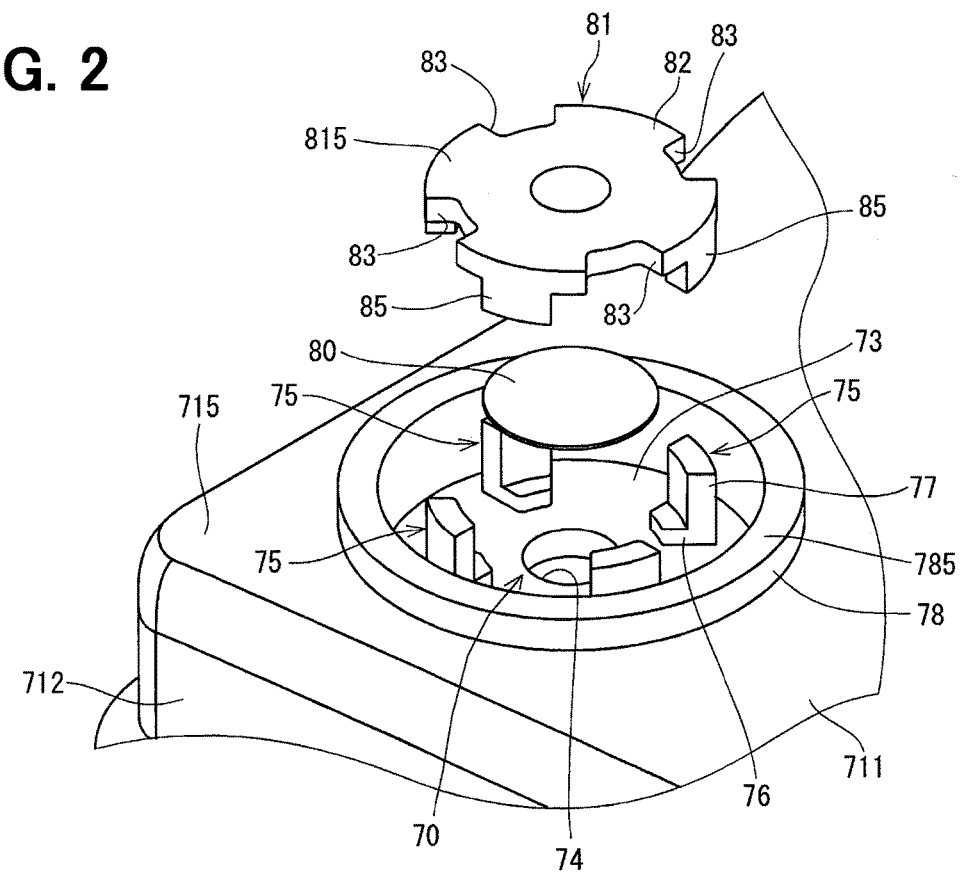
FIG. 2 is a schematically enlarged and exploded perspective view showing a casing cover, a filter element and a filter cover according to the first embodiment of the present disclosure.
Figure 3:
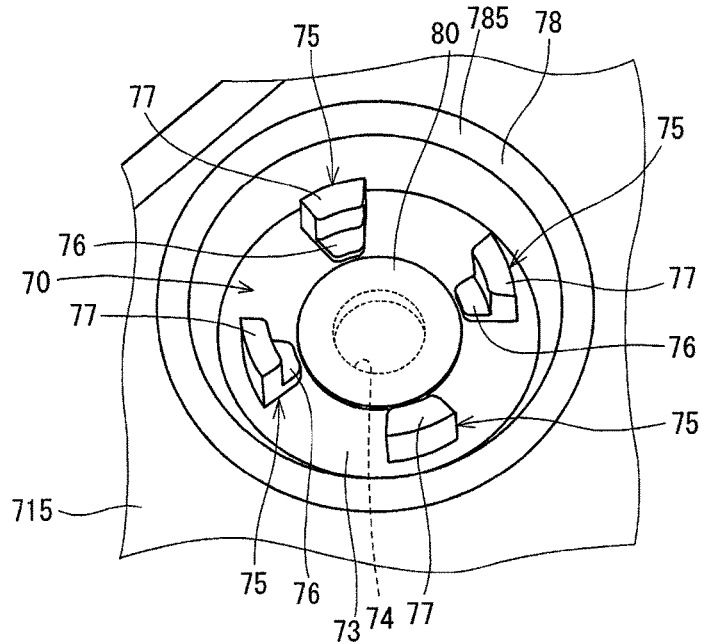
FIG. 3 is a schematic perspective view showing the filter element attached to the casing cover of the first embodiment.

As shown in FIGS. 2 and 3, a recessed portion 70 is formed in the top end portion 711 of the casing cover 71 as a filter accommodation portion. A filter fixing surface 73 is formed at a bottom of the recessed portion 70. The filter fixing surface 73 is also referred to as a bottom surface 73 of the recessed portion 70. The filter fixing surface 73 is formed at a position, which is recessed in the axial direction to the electric motor 10 from an axial end surface 715 of the top end portion 711. An air breathing hole 74 is formed in the top end portion 711 at a center of the recessed portion 70, so that an outside end (an upper-side end) of the air breathing hole 74 is opened at the filter fixing surface 73, while an inside end (a lower-side end; not shown in the drawings) is opened at a front surface of the casing cover 71. As above, the air breathing hole 74 communicates the accommodation space 49 to an outside of the water-proof casing 50 of the driving device 1. In the present embodiment, a cross section of the air breathing hole 74 is formed in a circular shape.

Four columnar portions 75 are provided in the recessed portion 70 on the filter fixing surface 73 at a radial outside of the air breathing hole 74. Each of the columnar portions 75 has a filter positioning portion 76 formed at a lower end of the columnar portion 75 and extending in a radial inward direction from the lower end toward the air breathing hole 74. The columnar portion 75 has a cover positioning portion 77 formed at a radial outside of the filter positioning portion 76. A height of the cover positioning portion 77 in the axial direction is larger than that of the filter positioning portion 76.

A peripheral wall portion 78 is formed at the recessed portion 70 at a radial-outside of the columnar portions 75. In the present embodiment, the peripheral wall portion 78 is formed in a circular shape, so that the peripheral wall portion 78 continuously extends in its circumferential direction. The peripheral wall portion 78 is outwardly projected in the axial direction (in an upward direction) from the top end portion 711. The peripheral wall portion 78 is separated from each of the columnar portions 75 in the radial direction.

A filter element 80, which is made of such material having water-proof property and ventilation characteristic, is formed in a disc shape. The filter element 80 is attached to the filter fixing surface 73 (on a side opposite to the electric motor 10) so as to cover the outside end of the air breathing hole 74. The filter element 80 is thermally adhered to the casing cover 71. According to the above structure, the accommodation space 49 has water-proof property and it is possible to suppress a pressure change in the accommodation space 49, which may be caused by a temperature change in the driving device 1.

The filter element 80 has a shape (a size) corresponding to a filter fixing area defined in an inside of the filter positioning portions 76. More exactly, the filter element 80 is slightly smaller than the filter fixing area in the radial direction. According to such a structure, the filter element 80 can be properly and easily positioned by the filter positioning portions 76 with respect to the recessed portion 70.

As shown in FIGS. 1 to 10, a filter cover 81 is arranged at a position above the filter element 80 and inside of the peripheral wall portion 78 so as to cover the filter element 80.

Figure 8:
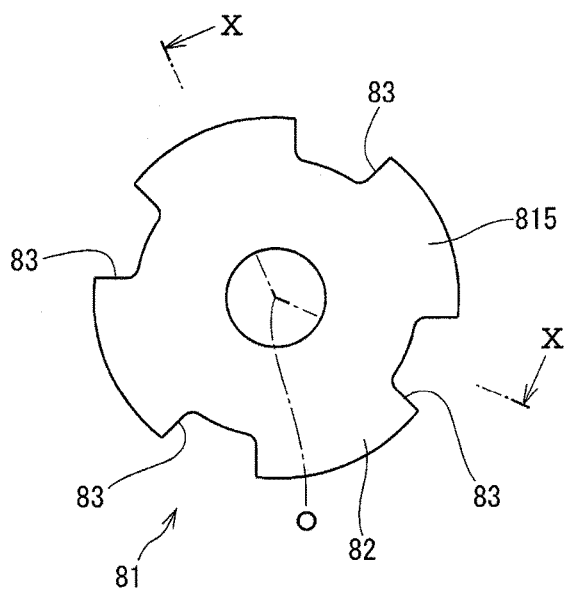
FIG. 8 is a top plane view showing the filter cover of the first embodiment.
Figure 9:
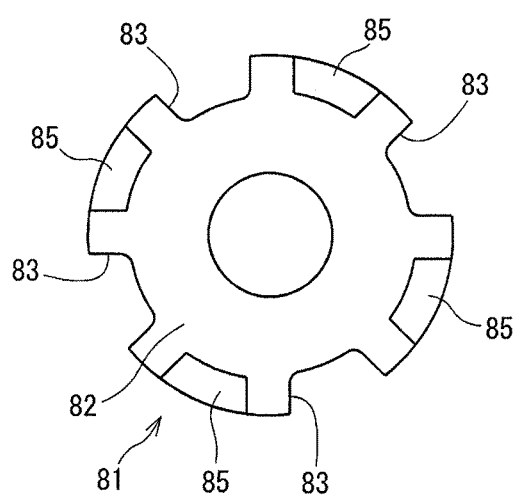
FIG. 9 is a bottom plane view showing the filter cover of the first embodiment.
Figure 10:
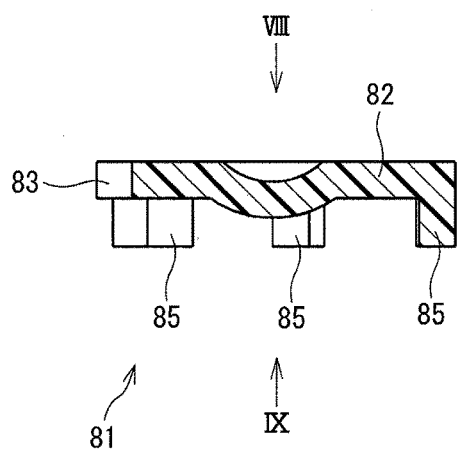
FIG. 10 is a schematic cross sectional view taken along a line X-O-X in FIG. 8.

As shown in FIGS. 8 to 10, the filter cover 81, which is made of resin, has a flat plate portion 82 and multiple leg portions 85 (four leg portions 85 in the present embodiment). FIG. 8 shows a top plane of the filter cover 81, that is, a rear side plane opposite to the electric motor 10 when it is assembled to the casing cover 71. More exactly, FIG. 8 is a view when viewed the filter cover 81 in a direction indicated by an arrow VIII in FIG. 10. FIG. 9 shows a front side of the filter cover 81, that is, FIG. 9 is a view of the filter cover 81 on the side to the electric motor 10 when it is assembled to the casing cover 71. More exactly, FIG. 9 is a view when viewed the filter cover 81 in a direction indicated by an arrow IX in FIG. 10.

Multiple (four) notched portions 83 are formed at an outer periphery of the flat plate portion 82. Each of the notched portions 83 has a shape corresponding to that of the cover positioning portion 77. A number of the notched portions 83 corresponds to that of the cover positioning portions 77. The filter cover 81 is arranged at a position in such a manner that each of the notched portions 83 is fitted to the respective cover positioning portion 77. According to such a structure, the filter cover 81 can be easily and correctly positioned to the filter element 80 and the air breathing hole 74. In the present embodiment, fitting portions between the filter cover 81 and the cover positioning portions 77 are thermally adhered, so that the filter cover 81 is firmly fixed to the casing cover 71.

Figure 4:
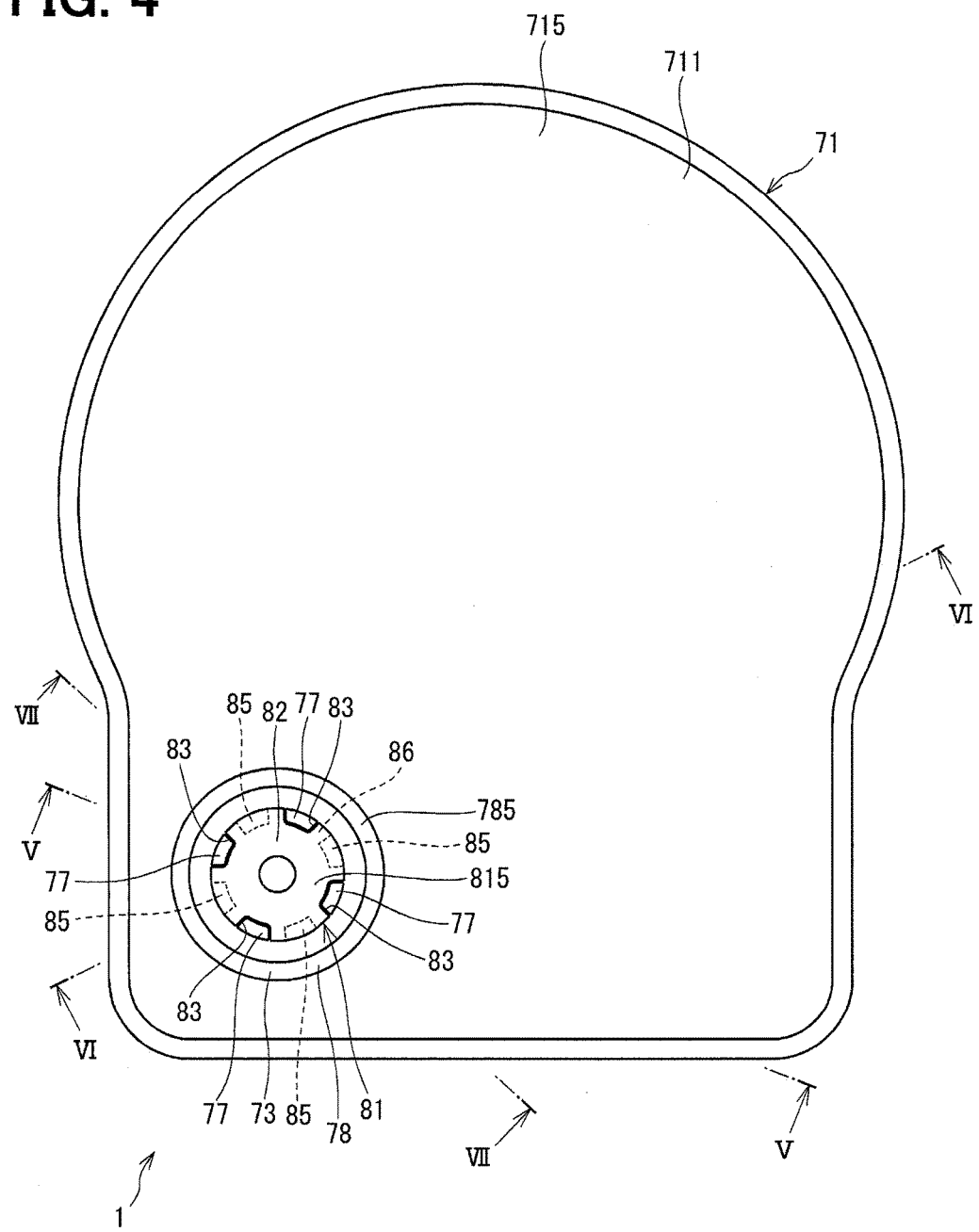
FIG. 4 is a schematic top plane view of the driving device of FIG. 1.

As shown in FIG. 4, the filter cover 81 is separated from the peripheral wall portion 78 in the radial direction, in a condition that the filter cover 81 is fixed to the casing cover 71.

Each of the leg portions 85 is formed at the outer periphery of the flat plate portion 82, at such portions at which the notched portions 83 are not formed. Each of the leg portions 85 extends in the axial direction (a thickness direction of the flat plate portion 82). When the filter cover 81 is fixed to the casing cover 71, a forward end of each leg portion 85 is in contact with the filter fixing surface 73, as shown in FIG. 6.

Each of the notched portions 83 is separated from the neighboring leg portions 85 in the circumferential direction. As shown in FIG. 4, when the filter cover 81 is fixed to the casing cover 71, air ventilation portions 86 are formed between each of the columnar portions 75 and each of the leg portions 85 in the circumferential direction. As shown in FIGS. 4 to 7, positions for the cover positioning portions 77 (FIG. 5) or positions of the leg portions 85 (FIG. 6) and positions of the air ventilation portions 86 are alternately arranged along the outer periphery of the filter cover 81, when the filter cover 81 is fixed to the casing cover 71.

In addition, since the filter cover 81 is separated from the peripheral wall portion 78 in the radial direction, an inside space formed inside of the filter cover 81 is communicated to the outside of the driving device 1 via the air ventilation portions 86. Accordingly, it is possible to properly control the inside pressure of the driving device 1.

Figure 5:
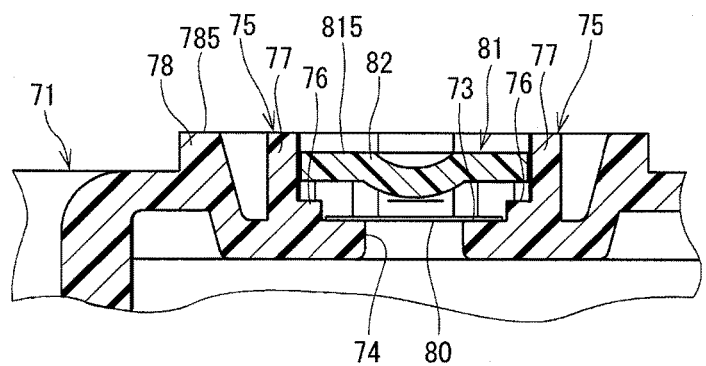
FIG. 5 is a schematic cross sectional view taken along a line V-V in FIG. 4.
Figure 6:
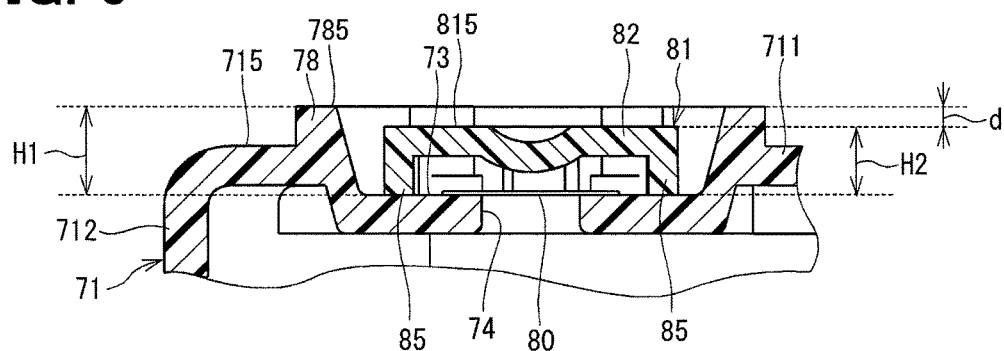
FIG. 6 is a schematic cross sectional view taken along a line VI-VI in FIG. 4.
Figure 7:
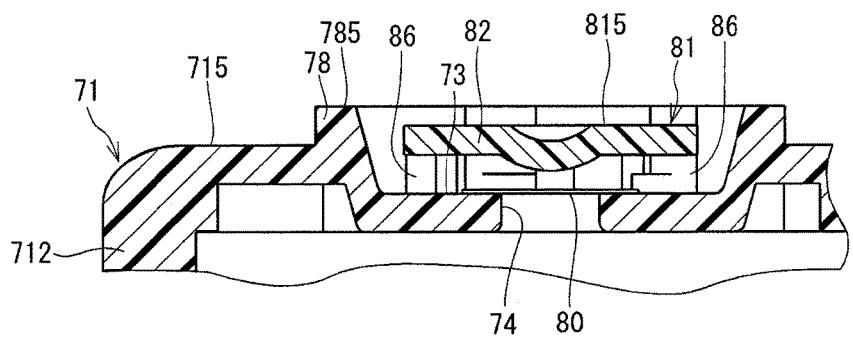
FIG. 7 is a schematic cross sectional view taken along a line VII-VII in FIG. 4.

Each of FIGS. 5 to 7 is a cross sectional view corresponding to respective cross sections in FIG. 4. In each of FIGS. 5 to 7, the filter cover 81 and its related portions are schematically enlarged.

As shown in FIG. 6, a height "H1" of the peripheral wall portion 78 from the filter fixing surface 73 is larger than a height "H2" of the filter cover 81 from the filter fixing surface 73. In other words, the peripheral wall portion 78 is taller than the filter cover 81 by a height "d". Therefore, a top end surface 815 of the filter cover 81 is located at a position, which is lower than a top end surface 785 of the peripheral wall portion 78, when the filter cover 81 is fixed to the casing cover 71. Namely, the top end surface 815 is recessed from the top end surface 785 in the axial direction to the electric motor 10.

Since the driving device 1 is located in the engine room of the vehicle, a relatively large external force may be applied to the filter cover 81, for example, by collision of a flying stone during a running of the vehicle. In a case that the filter cover 81 is fixed to the casing cover 71 by the adhesive material, strength poverty may occur depending on the external force to be applied to the filter cover 81. According to the present embodiment, therefore, the filter cover 81 is thermally adhered to the casing cover 71 by a thermal welding process, in order to increase adhesion strength when compared with the case of the adhesive material. In addition, the height of the peripheral wall portion 78 is made to be larger than that of the filter cover 81, so that the flying stone is not likely to directly collide against the filter cover 81. According to the above structure, it is possible to prevent a situation that the filter cover 81 drops out of the casing cover 71 and the filter element 80 is thereby exposed to the outside of the driving device 1.

As explained above, the water-proof casing 50 (the accommodation device) of the present embodiment has the connector casing 51, the casing cover 71, the filter element 80 and the filter cover 81.

The control unit 30 (the protective component) is accommodated in the accommodation space 49 formed by the connecter casing 51 and the casing cover 71. The air breathing hole 74 is formed in the casing cover 71 for communicating the accommodation space 49 with the outside of the driving device 1. The casing cover 71 is fixed to the connector casing 51.

The filter element 80 covers the outside end of the air breathing hole 74, that is, the rear side of the casing cover 71 opposite to the accommodation space 49. The filter element 80 is attached to the casing cover 71. The filter cover 81, which covers the filter element 80 on the side of the casing cover 71 opposite to the accommodation space 49, is fixed to the casing cover 71.

The cover positioning portions 77 are formed on the casing cover 71 for positioning the filter cover 81 to the casing cover 71.

In the present embodiment, the filter element 80, which is made of the material having the water-proof property and the ventilation characteristic, covers the air breathing hole 74 so as to not only prevent the water from entering the inside of the water-proof casing 50 but also properly control the inside pressure of the water-proof casing 50. Since the filter element 80 is covered by the filter cover 81, it is possible to properly protect the filter element 80. In addition, the cover positioning portions 77 are formed in the recessed portion 70 of the casing cover 71 in order to correctly position the filter cover 81 with respect to the casing cover 71. It is, therefore, possible to easily assemble the filter cover 81 to the casing cover 71.

The peripheral wall portion 78 of the recessed portion 70 is formed on the casing cover 71 at the radial outside of the filter cover 81. The peripheral wall portion 78 continuously surrounds the filter element 80 and the filter cover 81 in the circumferential direction. The height "H1" of the peripheral wall portion 78 from the filter fixing surface 73 is made to be larger than the height "H2" of the filter cover 81 from the filter fixing surface 73. Accordingly, the extraneous material, such as, the flying stone, cannot easily and directly collide against the filter cover 81.

The filter positioning portions 76 are formed in the recessed portion 70 of the casing cover 71. It is, therefore, possible to properly position the filter element 80 with respect to the casing cover 71.

The filter positioning portion 76 is integrally formed with the cover positioning portion 77. It is, therefore, possible to form the filter positioning portion 76 and the cover positioning portion 77 in a relatively small area. In other words, a size of the driving device 1 can be made smaller.

The filter cover 81 has the flat plate portion 82 and the leg portions 85. The notched portions 83, each of which is fitted to the respective cover positioning portion 77, are formed in the flat plate portion 82. Each of the leg portions 85 is projected in the axial direction from the flat plate portion 82 and its forward end is brought into contact with the casing cover 71.

The air ventilation portions 86 are formed between each of the cover positioning portions 77 and each of the leg portions 85, in the condition that the filter cover 81 is fixed to the casing cover 71.

According to the above structure, it is possible to properly control the inside pressure of the water-proof casing 50.

The filter cover 81 is thermally adhered to the casing cover 71. The filter element 80 is likewise thermally adhered to the casing cover 71. According to the above structure, it is possible to increase peeling strength, when compared with the case in which the filter element 80 as well as the filter cover 81 is fixed to the casing cover 71 by the adhesive material.

The driving device 1 of the present embodiment has the water-proof casing 50 (the accommodation device) and the control unit 30 (the protective component), which includes the power circuit board 32 and the power modules 35 as the electronic components. According to the present embodiment, it is possible to properly protect the control unit 30 (the protective component) from the extraneous material.

Second Embodiment

Figure 11:
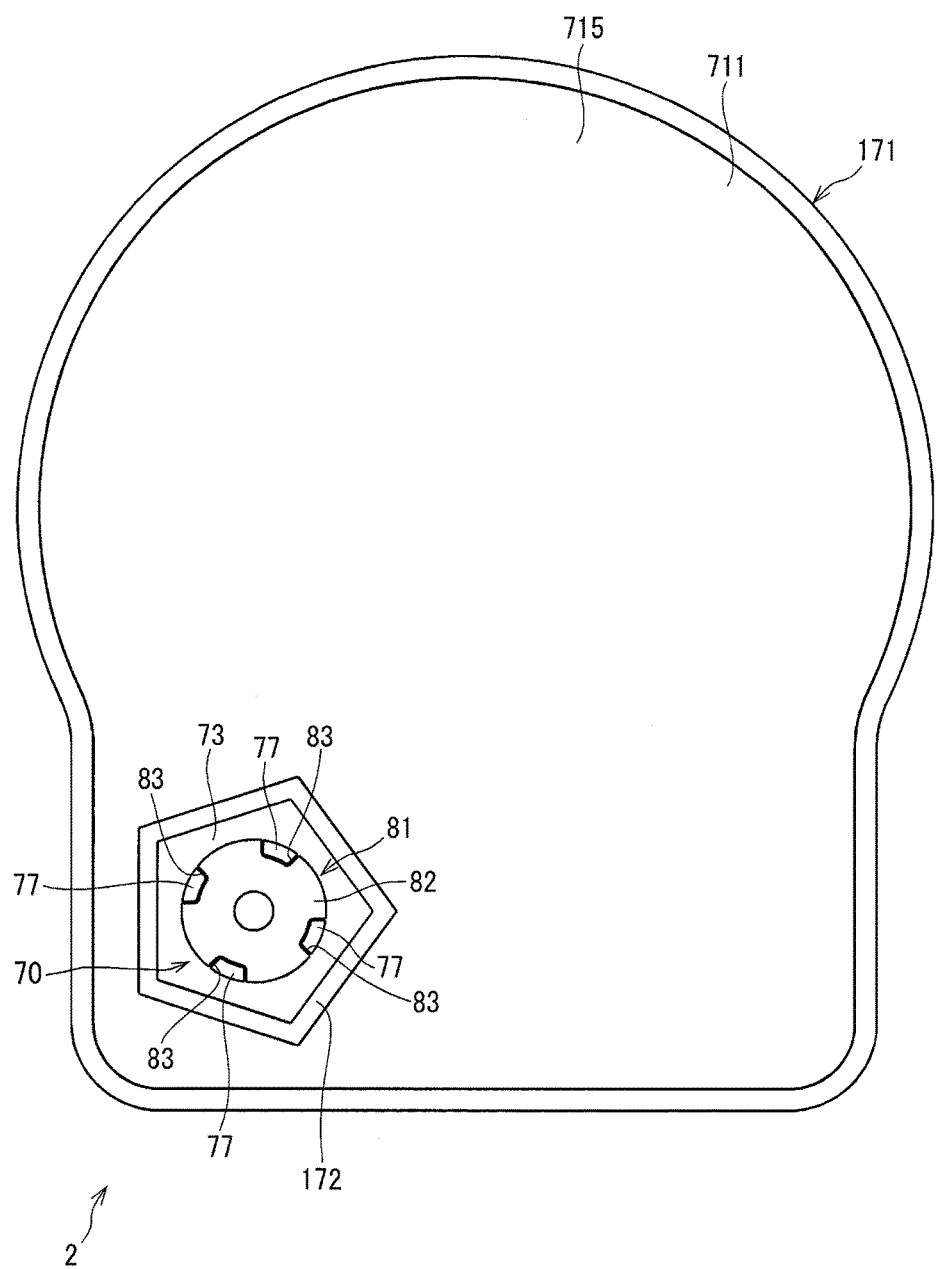
FIG. 11 is a schematic top plane view showing a driving device according to a second embodiment of the present disclosure.

A driving device 2 according to a second embodiment of the present disclosure is shown in FIG. 11.

A casing cover 171 of the driving device 2 of the second embodiment differs from that of the first embodiment. More exactly, a shape of a peripheral wall portion 172 is different from that of the first embodiment.

As shown in FIG. 11, which is a view showing a rear side of the driving device 2 when viewed it from an opposite side to the electric motor 10 (not shown in FIG. 11), the peripheral wall portion 172 is formed in a pentagonal shape. The peripheral wall portion 172 may be formed in any other polygonal shape, such as, a rectangular shape, a hexagonal shape and so on.

The same advantages to those of the first embodiment can be also obtained in the second embodiment.

Third Embodiment

Figure 12:
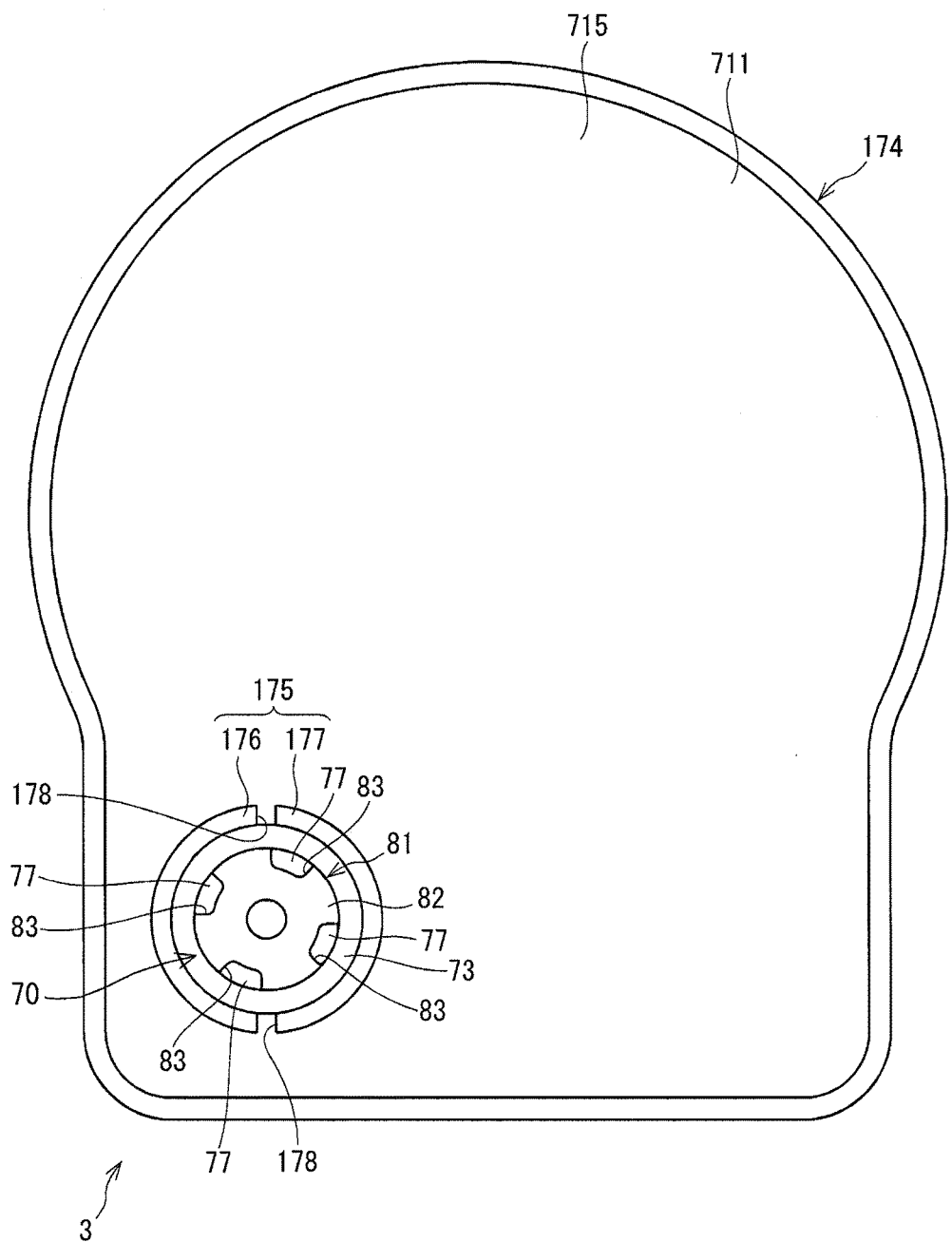
FIG. 12 is a schematic top plane view showing a driving device according to a third embodiment of the present disclosure.

A driving device 3 according to a third embodiment of the present disclosure is shown in FIG. 12.

A casing cover 174 of the driving device 3 of the third embodiment differs from that of the first embodiment. More exactly, a shape of a peripheral wall portion 175 is different from that of the first embodiment.

As shown in FIG. 12, which is a view showing a rear side of the driving device 3 when viewed it from an opposite side to the electric motor 10 (not shown in FIG. 12), the peripheral wall portion 175 is formed in a circular shape in the same manner to the first embodiment. However, the peripheral wall portion 175 of the present embodiment is composed of a first wall portion 176 and a second wall portion 177. A pair of grooves 178 is formed between the first and the second wall portions 176 and 177 in its circumferential direction. In the first embodiment, the peripheral wall portion 78 continuously surrounds the recessed portion 70 for the filter element 80, the filter cover 81 and the cover positioning portions 77. In the third embodiment, however, the first and the second wall portions 176 and 177 intermittently surround the recessed portion 70 for the filter element 80, the filter cover 81 and the cover positioning portions 77. According to the above structure, it is possible to increase a productivity of a step for assembling the filter element 80 and the filter cover 81 to the casing cover 71.

In addition, the same advantages to those of the first embodiment can be also obtained in the third embodiment.

Further Modifications

In the above embodiments, the recessed portion 70 is formed in the rear side of the casing cover 71 (171, 174), that is, the axial side of the driving device 1 (2, 3) opposite to the electric motor 10. However, the recessed portion 70 may be formed in the casing cover 71 (171, 174) at any other portion, such as, the peripheral wall portion 712 of the casing cover 71 (171, 174), so long as it is possible to communicate the accommodation space 49 to the outside of the driving device 1 (2, 3) via the air breathing hole 74.

In the above embodiments, the recessed portion 70 is formed in the cylindrical shape. However, the recessed portion 70 may be formed in any other shape than the cylindrical shape.

In the above embodiments, the peripheral wall portion 78 of the recessed portion 70 is made to be taller than the top end surface 715 of the casing cover 71 (171, 174). The height of the peripheral wall portion 78 may be made to be the same level to that of the top end surface 715 of the casing cover 71 (171, 174), so long as the peripheral wall portion 78 is taller than the filter cover 81. In this case, the top end surface 715 of the casing cover 71 (171, 174) works itself as the peripheral wall portion for the recessed portion 70. In other words, the peripheral wall portion 78 outwardly projecting is not necessarily formed for the recessed portion 70.

In the above embodiments, the recessed portion 70 is formed as the filter accommodation portion. However, the present disclosure is not limited to the recessed portion. For example, the filter accommodation portion may be formed in such a manner that the filter fixing surface 73 (that is, the bottom surface of the filter accommodation portion) is formed on the same level to that of the axial end surface 715 of the casing cover 71 and the peripheral wall portion 78 is upwardly projected from the bottom surface. Alternatively, the bottom surface of the filter accommodation portion may be formed at a position elevated in the upward direction from the axial end surface 715 of the casing cover 71.

In the third embodiment shown in FIG. 12, the pair of the grooves 178 is formed between the first and the second wall portions 176 and 177 in the circumferential direction. The number as well as the shape of the grooves 178 is not limited to those of the third embodiment shown in FIG. 12, so long as the filter cover 81 and the filter element 80 can be protected from the extraneous material, such as the flying stone.

In the second embodiment shown in FIG. 11, the peripheral wall portion 172 is formed in the polygonal shape. The grooves 178 of the third embodiment may be formed at edges of the polygonal shape. In addition, the peripheral wall portion 172 for the recessed portion 70 may be formed in any other forms than the circular shape and the polygonal shape.

In the above embodiments, the cover positioning portion 77 and the filter positioning portion 76 are integrally formed as one unit. However, the cover positioning portion 77 may be formed as a separate member from the filter positioning portion 76. Alternatively, the cover positioning portion 77 may not be necessarily formed.

In the above embodiments, four cover positioning portions 77 are formed. A number of the cover positioning portions 77 is not limited to four. The shape of the cover positioning portion 77 is not limited to the shape shown in the embodiments, for example, shown in FIG. 2, so long as it is possible to correctly position the filter cover 81 in the recessed portion 70. In the same manner, the number and the shape of the filter positioning portion 76 are not limited to those of the embodiments, for example, shown in FIG. 2.

In the above embodiments, the filter element 80 is thermally adhered to the casing cover 71. However, the filter element 80 may be fixed to the casing cover 71 by any other methods than the thermal adhesion.

In the above embodiments, the filter cover 81 is thermally adhered to the casing cover 71. However, the filter cover 81 may be fixed to the casing cover 71 by any other methods, for example, ultrasonic adhesion. In addition, the filter cover 81 may be fixed to the casing cover 71 by any other method than the adhesion, for example, by adhesive material.

In the above embodiments, the connector casing 51, to which the first and the second connector portions 53 and 54 are integrally formed, is formed as the casing body for accommodating the control unit 30. However, any other part or portion of the driving device 1 may be used as the casing body for accommodating the protective component (the control unit 30).

In the above embodiments, the connector casing 51 is formed in the cylindrical shape and one axial end thereof (on the side to the electric motor 10) is closed by the rear end frame 13 of the electric motor 10. However, the casing body for accommodating the protective component may be formed in a cup shape having a closed bottom on the side to the electric motor 10 and having an open end on the side to the casing cover 71.

In the above embodiments, the protective component is composed of the control unit 30 having the control circuit board, the power circuit board 32 and the power modules 35. However, the protective component may include any other electronic or non-electronic parts, so long as they are accommodated in the accommodation space 49.

In the above embodiments, the accommodation device (the water-proof casing 50) is applied to the driving device 1, in which the electric motor 10 and the control unit 30 are integrally assembled to each other. However, the accommodation device may be applied to any other electronic devices other than the driving device 1 (2, 3) of the above embodiments.

In the above embodiments, the driving device 1 (2, 3) is applied to the electric power steering device for the vehicle, which is usually located in the engine room. The driving device 1 (2, 3) may be located in any other places than the engine room. The driving device may be applied to any other electronic devices for the vehicle or any other electronic devices for use of non-automotive purpose.

The present disclosure is not limited to the above embodiments and/or modifications but can be further modified in various manners without departing from a spirit of the present disclosure.

What is claimed is:

1. An accommodation device comprising:
   a casing body for accommodating a protective component;
   a casing cover fixed to the casing body so as to form an accommodation space for accommodating the protective component, an air breathing hole being formed in the casing cover for communicating the accommodation space to an outside of the accommodation device;
   a filter accommodation portion formed on a part of an outside surface of the casing cover and having a bottom surface formed on the part of the outside surface of the casing cover, wherein an outside end of the air breathing hole is opened at the bottom surface while an inside end of the air breathing hole is opened at an inside surface of the casing cover;
   a filter element fixed to the bottom surface of the filter accommodation portion for covering the outside end of the air breathing hole;
   a filter cover located at the outside surface of the casing cover and fixed to the casing cover for covering the filter element;
   a cover positioning portion formed in the filter accommodation portion of the casing cover for positioning the filter cover with respect to the filter accommodation portion; and
   a peripheral wall portion formed on the outside surface of the casing cover for surrounding the filter accommodation portion,
   wherein a height of the peripheral wall portion from the bottom surface of the filter accommodation portion is larger than a height of the filter cover from the bottom surface.

2. The accommodation device according to claim 1, wherein the peripheral wall portion continuously surrounds the filter accommodation portion in its circumferential direction.

3. The accommodation device according to claim 1, wherein a pair of groove are formed in the peripheral wall portion, so that the peripheral wall portion is divided into a first wall portion and a second wall portion in the circumferential direction.

4. The accommodation device according to claim 1, further comprising:
   a filter positioning portion for positioning the filter element with respect to the filter accommodation portion of the casing cover.

5. The accommodation device according to claim 4, wherein the cover positioning portion and the filter positioning portion are integrally formed with each other as one unit.

6. The accommodation device according to claim 1, wherein the filter cover has a flat plate portion and multiple leg portions, multiple notched portions are formed in the flat plate portion, each of the leg portions extends from the flat plate portion in a direction to the bottom surface of the filter accommodation portion, so that a forward end of each leg portion is in contact with the bottom surface, and multiple air ventilation portions are formed between each of the cover positioning portions and each of the leg portions in a condition that the filter cover is fixed to the casing cover.

7. The accommodation device according to claim 1, wherein the filter cover is fixed to the casing cover by adhesion.

8. The accommodation device according to claim 1, wherein the filter member is fixed to the casing cover by adhesion.

9. An electronic device for a vehicle comprising:
   the accommodation device according to claim 1; and
   the protective component, which is composed of electronic parts and/or components.

10. An accommodation device comprising:
    a casing body for accommodating a protective component;
    a casing cover fixed to the casing body so as to form an accommodation space for accommodating the protective component, an air breathing hole being formed in the casing cover for communicating the accommodation space to an outside of the accommodation device;
    a recessed portion formed on a part of an outside surface of the casing cover and having a bottom surface formed on the part of the outside surface of the casing cover, wherein an outside end of the air breathing hole is opened at the bottom surface while an inside end of the air breathing hole is opened at an inside surface of the casing cover;
    a filter element fixed to the bottom surface of the recessed portion for covering the outside end of the air breathing hole;
    a filter cover located at the outside surface of the casing cover and fixed to the casing cover for covering the filter element;
    a cover positioning portion formed in the recessed portion of the casing cover for positioning the filter cover with respect to the recessed portion; and
    a peripheral wall portion formed on the outside surface of the casing cover for surrounding the filter accommodation portion,
    wherein a height of the peripheral wall portion from the bottom surface of the filter accommodation portion is larger than a height of the filter cover from the bottom surface.

* * * * *